United States Patent
Komiya et al.

(10) Patent No.: US 7,046,082 B2
(45) Date of Patent: May 16, 2006

(54) ELECTRONIC DEVICE HAVING SOUND OUTPUT MODULE

(75) Inventors: Kunihiro Komiya, Kyoto (JP); Tadayuki Sakamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 180 days.

(21) Appl. No.: 10/746,813

(22) Filed: Dec. 24, 2003

(65) Prior Publication Data

US 2004/0161123 A1    Aug. 19, 2004

(30) Foreign Application Priority Data

Dec. 27, 2002   (JP) .............................. 2002-379943

(51) Int. Cl.
    *H03F 1/14*    (2006.01)

(52) U.S. Cl. ........................................ 330/51; 330/296

(58) Field of Classification Search .................. 330/51, 330/296
    See application file for complete search history.

(56) References Cited

U.S. PATENT DOCUMENTS

| | | | | |
|---|---|---|---|---|
| 5,932,827 A | * | 8/1999 | Osborne et al. | 84/726 |
| 6,201,440 B1 | * | 3/2001 | Kobayashi | 330/51 |
| 6,215,987 B1 | * | 4/2001 | Fujita | 455/127.3 |
| 6,288,608 B1 | * | 9/2001 | Jadus et al. | 330/124 R |
| 6,724,252 B1 | * | 4/2004 | Ngo et al. | 330/133 |
| 6,735,034 B1 | * | 5/2004 | Manjrekar et al. | 360/61 |

FOREIGN PATENT DOCUMENTS

| | | |
|---|---|---|
| JP | 5-136634 | 6/1993 |
| JP | 8-18342 | 1/1996 |

* cited by examiner

*Primary Examiner*—Patricia Nguyen
(74) *Attorney, Agent, or Firm*—Hamre, Schumann, Mueller & Larson, P.C.

(57) ABSTRACT the output amplifiers requiring a bias voltage can be activated or deactivated individually, and a bias acceleration circuit for rapidly increasing the magnitude of a bias voltage in time can be provided in or with the bias circuit, whereby even in case of the capacitance of the capacitor included in the bias circuit being increased for improving the power supply rejection ratio (PSRR), the rise in the bias voltage can be increased so that the pop sound which arises when the bias circuit is activated can be still diminished.

6 Claims, 11 Drawing Sheets

ELECTRONIC DEVICE HAVING SOUND OUTPUT MODULE

BACKGROUND OF THE INVENTION

1. Field of the Invention

The present invention relates to an electronic device having a sound output module which produces a smaller pop-up sound upon startup.

2. Description of the Related Art

An electronic device having a sound output module or circuit in it is configured such that upon startup a bias of an output amplification circuit or a like circuit is gradually increased at a certain time constant in order to prevent occurrence of (or reduce) a pop sound (a so-called "snap sound") which is offensive to the ears.

FIG. 12 is a view showing an example configuration of an electronic device having a related-art sound output module. In the drawing, a sound signal processing IC 200 has a preamplifier 10 and output amplifiers 20, 20A and subjects, to signal processing, an input signal Vin incoming from a signal input terminal Pin, thereby outputting an output signal Vout from a signal output terminal Pout or PoutA. The signal Vout output from the signal output terminal Pout is supplied to a speaker Sp by way of a coupling capacitor Cc. As for the signal output from the signal output terminal PoutA, it is used for a sound output device, such as an earphone.

The preamplifier 10 has an operational amplifier 11, a resistor 13 being coupled between the input terminal and the output terminal thereof, and an input resistor 12. A first bias voltage Vb1 is supplied to the other input terminal of the operational amplifier 11. This preamplifier 10 performs the function of impedance matching or buffering. The output amplifier 20 has an operational amplifier 21, a resistor 23 connected across input and output terminals thereof, an input resistor 22, and an input signal switch 24. A bias voltage Vb1 is supplied to the other input terminal of the operational amplifier 21. The output amplifier 20A is analogous to the output amplifier 20.

A first bias circuit 30 supplies a bias voltage Vb1 which is generated at a node between resistors 31, 32 serially connected between a source voltage Vdd and the ground, to the preamplifier 10, the output amplifiers 20, 20A, and other required elements. An external capacitor 33 is connected in parallel with the resistor 32 via a capacitor connection terminal Pc1.

When the source voltage Vdd is applied to the sound signal processing IC 200 shown in FIG. 12, the bias voltage Vb1 gradually increases from a zero voltage and reaches a predetermined voltage with lapse of time. Therefore, although the preamplifier 10 and the output amplifier 20 are in an operable state, fluctuation in a d.c. voltage on an output side of the coupling capacitor Cc can be suppressed to a low level, thereby diminishing a pop sound. Thus, a bias voltage can be supplied from a bias source that is commonly used for a plurality of amplifiers requiring a bias voltage so that the entire configuration of the sound output module can be simplifed.

A sound output module configured to supply a bias voltage from a common bias source to a plurality of circuit blocks has been widely used as disclosed in Japanese unexamined patent publications JP Hei 8-18342 or JP Hei 5-136634.

A portable cellular phone is taken as an example of the electronic device including such a sound apparatus. As shown in FIG. 12, the portable cellular phone has a plurality of output terminals, such as the speaker signal output terminal Pout for outputting an output signal from the output amplifier 20; the earphone signal output terminal PoutA for outputting an output signal from the output amplifier 20A; and an external output signal output terminal PoutB for outputting an output signal from the preamplifier 10. In general, however, a portable cellular phone uses a battery as its power source. Therefor, it is required to minimize the power consumption so as to extend the operation time of the battery power source as long as possible. For overcoming this requirement, in a related art, the portable cellular phone is configured such that an ON-OFF control signal Vpon, which is input from ON-OFF signal input terminals Pon and PonA, is provided with each output amplification circuit so as to activate only an output amplification circuit to be used at that point in time and deactivate an output amplification circuit which is not used. As the result of this configuration, upon being activated during the course of using the portable cellular phone, the output amplification circuit emits a pop sound.

SUMMARY OF THE INVENTION

Therefore, the present invention aims at providing an electronic device having a preamplifier and at least one output amplifier, which require a bias voltage, and a sound output module which enables individual activation/deactivation of the output amplifier(s) with reducing the pop sound generated at the time of activation thereof.

The present invention also aims at providing an electronic device having a sound output module which enables individual activation and deactivation of output amplifiers requiring a bias voltage, with a bias voltage being increased much more quickly, and reduces a pop soundgenerated at the time of activation.

An electronic device having a sound output module according to claim 1 is characterized by comprising; a preamplifier requiring a first bias voltage; at least one output amplifier, which can be activated and deactivated individually, requires a second bias voltage, and receives an output from the preamplifier; a first bias circuit for producing a first bias voltage to be supplied to the preamplifier; and a second bias circuit which includes a resistor and a capacitor and operates so as to produce the second bias voltage, the second bias voltage gradually increasing in accordance with an ON-state signal sent to the output amplifier.

An electronic device having a sound output module according to claim 2 is characterized by comprising: at least one output amplifier, which can be activated and deactivated individually, requires a bias voltage, and receives an output from a preamplifier; a bias circuit which includes a resistor and a capacitor and operates so as to produce the bias voltage, the bias voltage gradually increasing in accordance with an ON-state signal sent to the output amplifier; and a bias adjustment circuit which further increases, with time, the magnitude of a bias voltage which is produced by the bias circuit in accordance with the ON-state signal.

An electronic device having a sound output module according to claim 3 is characterized by the electronic device having a sound output module of claim 2, in which the bias adjustment circuit comprises a constant-current circuit for supplying a constant current to an output point of the bias circuit, and a voltage comparison circuit which initiates an operation in accordance with the ON-state signal and activates the constant-current circuit until the bias voltage reaches a predetermined voltage.

An electronic device having a sound output module according to claim 4 is characterized by the electronic device having a sound output module of claim 2, in which the bias adjustment circuit comprises: a resistor network which is connected between an output point of the bias circuit and a source voltage and enables a change in a resistance value by means of one or a plurality of switches; and a switch control circuit which initiates operation in accordance with the ON-state signal and produces a switch control signal for controlling the switch such that the resistance value of the resistor network is changed in a sequence of a decreasing resistance value and then in a sequence of an increasing resistance value.

An electronic device having a sound output module according to claim 5 is characterized by the electronic device having a sound output module of claim 4, in which the switch control circuit comprises a counter which is configured to receive the ON-state signal and a clock signal, counts the clock signal upon receipt of the ON-state signal, and outputs a predetermined count signal; and a logic circuit for producing the switch control signal in accordance with the count signal.

An electronic device having a sound output module according to claim 6 is characterized by the electronic device having a sound output module of claim 4, in which the switch control circuit comprises a plurality of comparators which compare the bias voltage with comparison voltages to produce comparison results; and a logic circuit for generating the switch control signal in accordance with comparison outputs from the plurality of comparators.

An electronic device having a sound output module according to claim 7 is characterized by the electronic device having a sound output module of claim 4, in which the switch control circuit comprises a counter which is configured to receive the ON-state signal and a clock signal, counts the clock signal upon receipt of the ON-state signal, and produces a predetermined count signal to be used during a first half period including a first switch control signal; a plurality of comparators for comparing the bias voltage with different comparison voltages in order to produce comparison results to be used during a second half period including a final switch control signal; and a logic circuit which receives the count signal and comparison outputs from the plurality of comparators, produces the switch control signal in accordance with the count signal during the first half period including the first switch control signal, and produces the switch control signal in accordance with the comparison outputs during the second half period including the final switch control signal.

DESCRIPTION OF THE PREFERRED EMBODIMENTS

Embodiments of an electronic device having a sound output module, which might be interchangeably used for a sound output unit or a sound output electric circuit, according to the invention will be described hereinbelow by reference to the drawings. The word "sound" herein signifies audio and sound.

Figure 1:
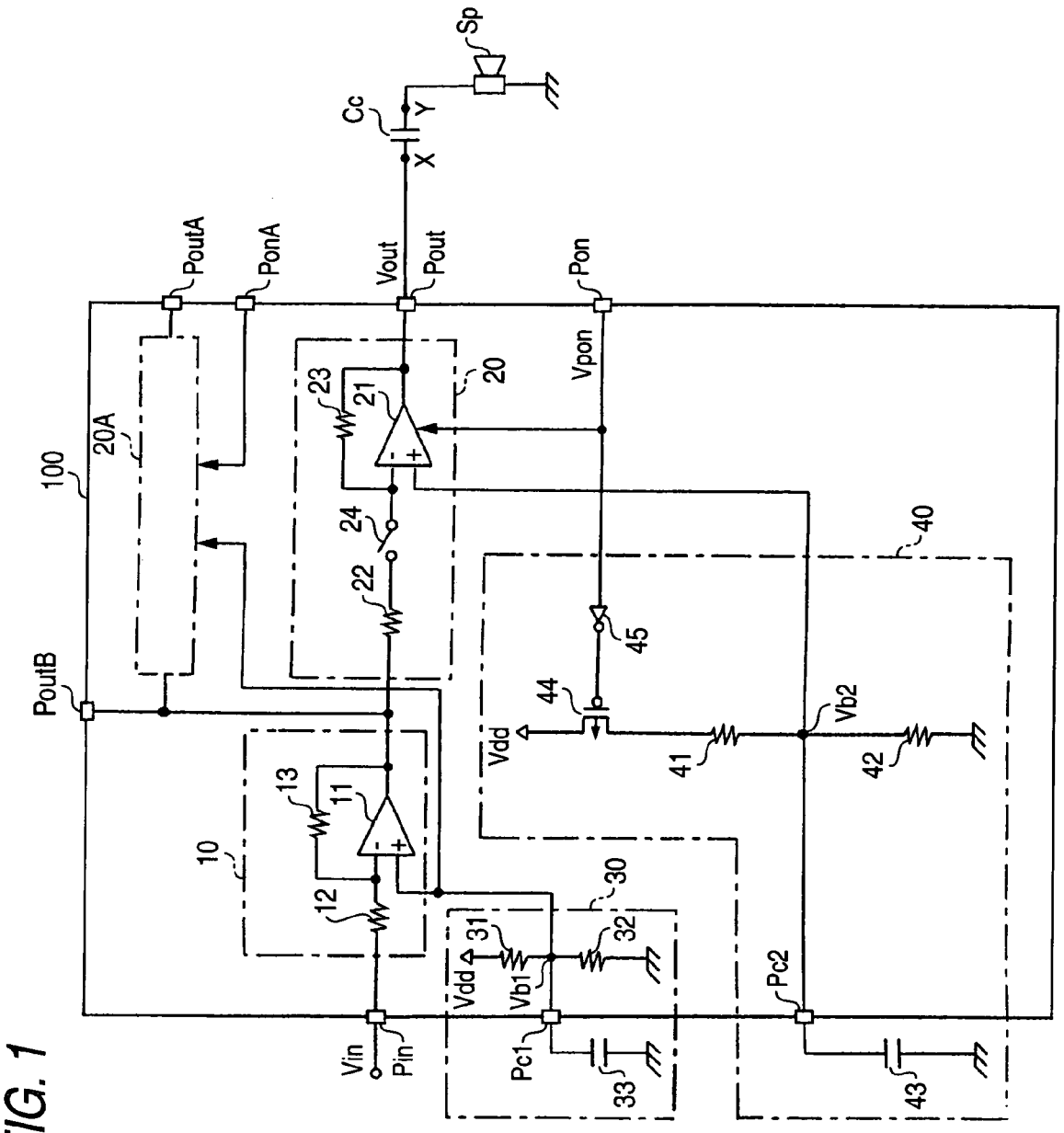
FIG. 1 is a view showing the configuration of an electronic device having a sound output module according to a first embodiment of the present invention.
Figure 2:
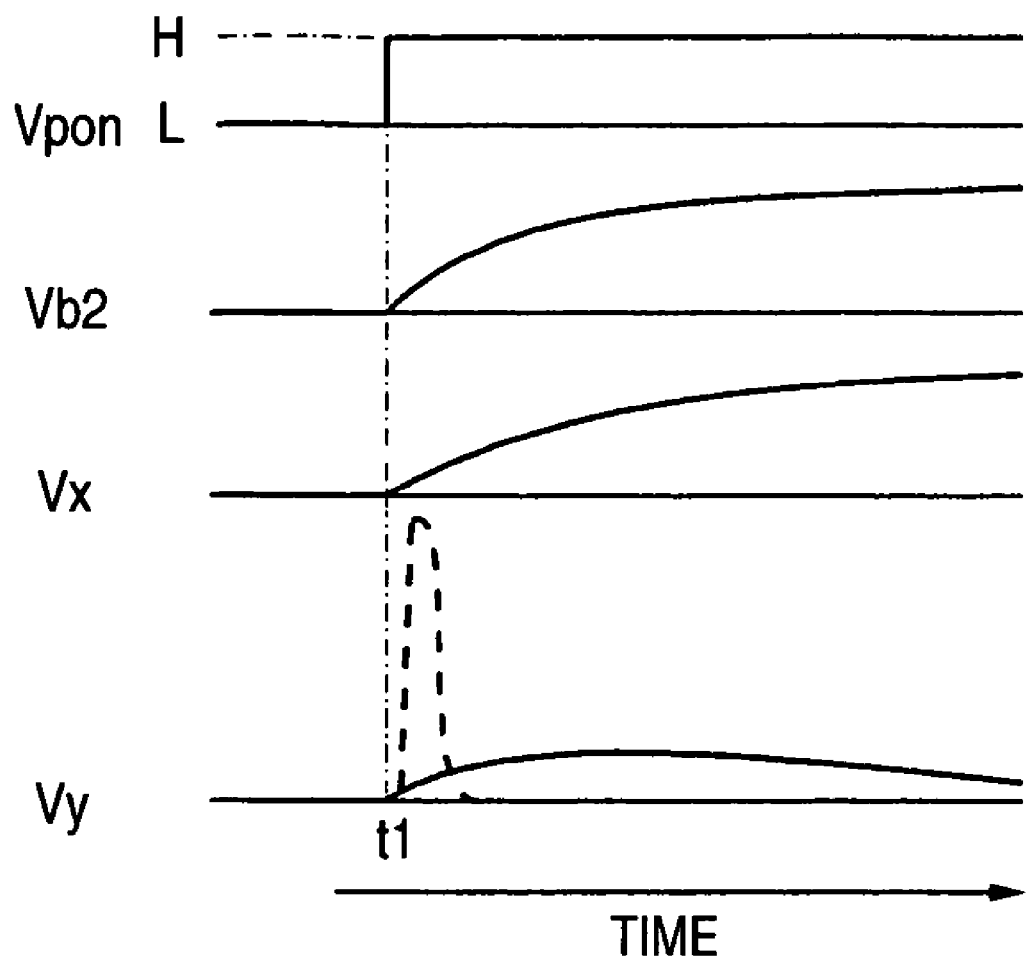
FIG. 2 is a view showing a characteristic of the electronic device shown in FIG. 1 when the device is activated.

FIG. 1 is a block diagram of an electronic device having a sound output module according to a first embodiment of the invention, and FIG. 2 is a view showing characteristics acquired at the time of activation of the electronic device.

Figure 12:
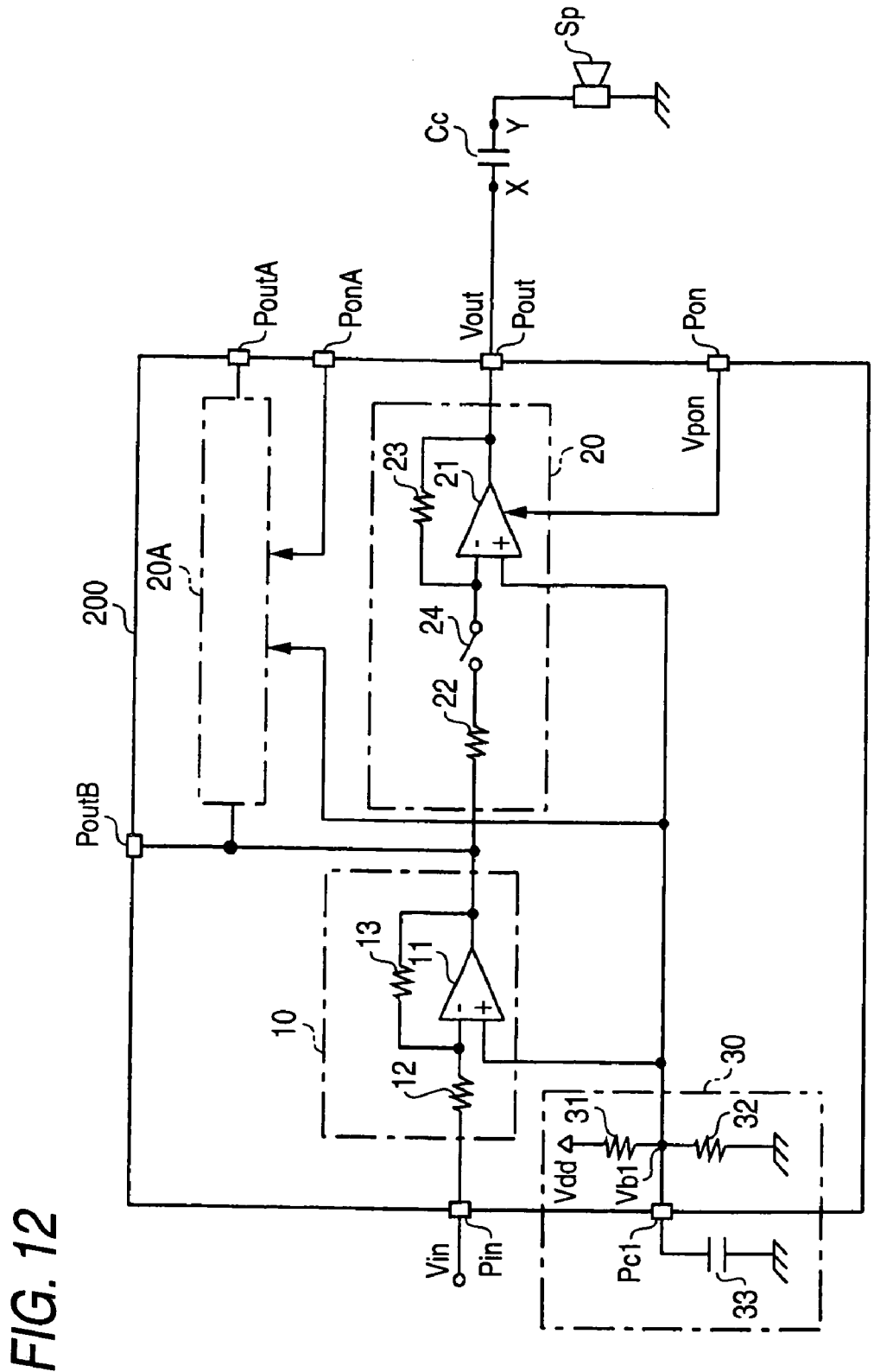
FIG. 12 is a view showing an example configuration of an electronic device having a related-art sound output module.

FIG. 1 differs from FIG. 12 in that the electronic device is provided with a second bias circuit 40 and is configured to supply to an output amplifier 20 a second bias voltage Vb2 output from the second bias circuit 40. In other respects, the electronic device is identical in configuration with that shown in FIG. 12, and corresponding constituent elements are assigned the same reference numerals.

The first bias voltage Vb1 output from the first bias circuit 30 is supplied to the preamplifier 10. An output from the preamplifier 10 is supplied to the speaker output amplifier 20, an earphone output amplifier 20A, and a signal output terminal PoutB.

A second bias circuit 40 is newly provided in the present embodiment where a p-type MOS transistor (PMOS) 44, a resistor 41, and a resistor 42 are serially connected between a source voltage Vdd and the ground. A node between the resistors 41, 42 is connected to a capacitor connection terminal Pc2. An external capacitor 43 is connected in parallel to the resistor 42 via the capacitor connection terminal Pc2. A second bias voltage Vb2 generated in a node between the resistors 41, 42 is supplied to the operational amplifier 21 of the output amplifier 20. Further, capacitors 33, 43 may be provided within a sound signal processing IC 100.

An ON-OFF control signal Vpon is applied to a gate of the PMOS 44 via an inverter circuit 45. When the operational amplifier 21 of the output amplifier 20 is activated by the applied source voltage Vdd, the PMOS 44 is brought into conduction state (On-state).

The resistance values of the resistors 41, 42 are determined so that a predetermined bias voltage Vb2 can be obtained by dividing the source voltage Vdd and the power consumption can be limited within the allowable range. Moreover, the capacitance of the capacitor 43 is determined in consideration of the speed of an increase in the bias voltage Vb2 obtained after activation of the PMOS 44, and also considered is a power supply rejection ratio (PSRR), which is a rate of fluctuations in the bias voltage Vb2, arising by the noise superimposed on the source voltage Vdd.

When the source voltage Vdd is applied to the sound signal processing IC 100 shown in FIG. 1, the bias voltage Vb1 of the first bias circuit 30 gradually increases from a zero volts and reaches a predetermined voltage with lapse of time. As the result of the bias voltage Vb1 having increased, the bias voltage of the operational amplifier 11 provided in the preamplifier 10 is determined, whereupon the input signal Vin is preamplified, thereby producing a sound signal. In this way, the produced sound signal is supplied to the output amplifiers 20, 20A.

When the ON-OFF control signal Vpon has reached a high (H) level in this state, the power is firstly applied to the output amplifier 20, thereby initiating operation (i.e., activation). Concurrently, the ON-OFF control signal Vpon is supplied to the second bias circuit 40, and the PMOS 44 is activated, thereby initiating an increase in the bias voltage Vb2.

FIG. 2 shows a characteristic of the output amplifier 20 when activated. When the ON-OFF control signal Vpon has increased from a low (L) level to an H level at a point in time t1, the bias voltage Vb2 gradually increases according to a time constant determined by the resistance values of the resistors 41, 42 and the capacitance value of the capacitor 43. Since the signal Vout output from the output amplifier 20 increases in the same manner as does the bias voltage Vb2, a voltage Vx of a point X located at an input side of the coupling capacitor Cc also gradually increases, as does the bias voltage Vb2. Meanwhile, a voltage Vy of a point Y located at an output side of the coupling capacitor Cc takes a value corresponding to a change in the voltage Vx.

Consequently, since the voltage Vy changes gradually, the pop sound emitted from a speaker Sp can be limited to a low level. As shown in FIG. 2, the voltage is compared with a characteristic designated by broken lines by reference to a change in the related-art voltage Vy, the voltage has become considerably small.

Before the output amplifier 20 is activated, an input signal switch 24 of the output amplifier 20 is opened. After the bias voltage Vb2 has increased to a predetermined value, the input signal switch 24 is closed. As a result, the sound signal output from the preamplifier 10 is output after having been amplified. Further, the input signal switch 24 is opened before deactivation of the output amplifier 20.

When the output amplifier 20 has been deactivated, electric charges stored in the coupling capacitor Cc are discharged in preparation for re-activation, by means of a high impedance of the operational amplifier 21 or an impedance circuit provided for discharge purpose so as not to produce a pop sound.

In FIG. 1, a bias voltage Vb1 of the first bias circuit 30 is employed as the bias voltage of the output amplifier 20A. Alternatively, a custom-designed bias circuit which is identical in configuration with the second bias circuit 40 might be additionally provided for the output amplifier 20A.

In FIG. 1, the ON-OFF signal input terminals Pon, PonA are separately provided so as to correspond to the output amplifiers 20, 20A. However, the ON-OFF signal input terminals might be also embodied as a common terminal. In this case, input ON-OFF signals are subjected to logic processing within the IC 100, and the output amplifiers 20, 20A are individually subjected to ON-OFF control operation in accordance with the processed signals.

As mentioned above, in a sound output module which has the preamplifier 10 requiring a bias voltage and one or a plurality of output amplifiers 20, 20A, the output amplifier(s) 20 can be individually activated or deactivated. By virtue of provision of a bias circuit 40 for use with the output amplifier, a pop sound produced at the time of activation is reduced.

Figure 3:
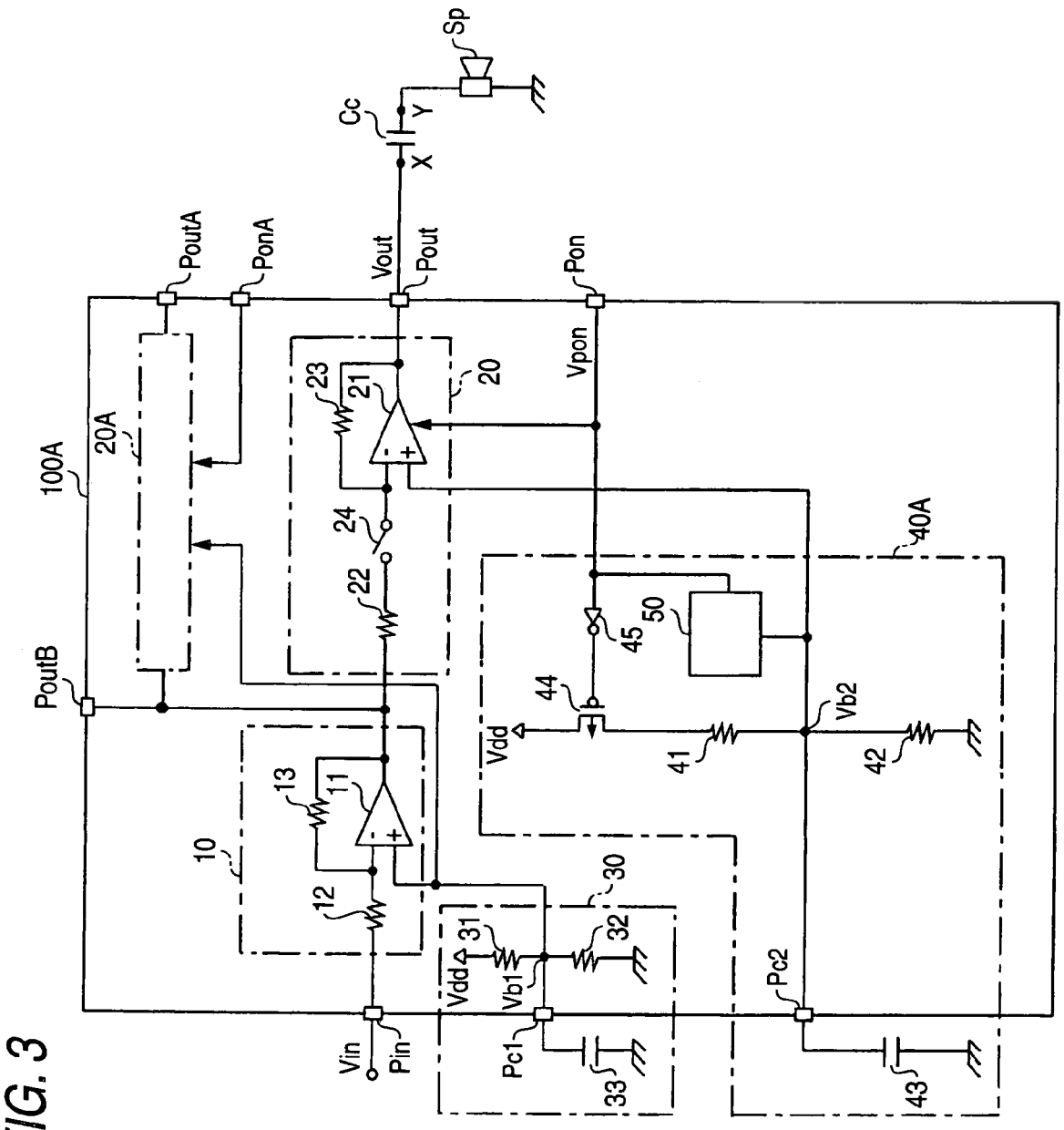
FIG. 3 is a view showing the configuration of an electronic device having a sound output module according to a second embodiment of the present invention when the device is equipped with a bias acceleration circuit.
Figure 4:
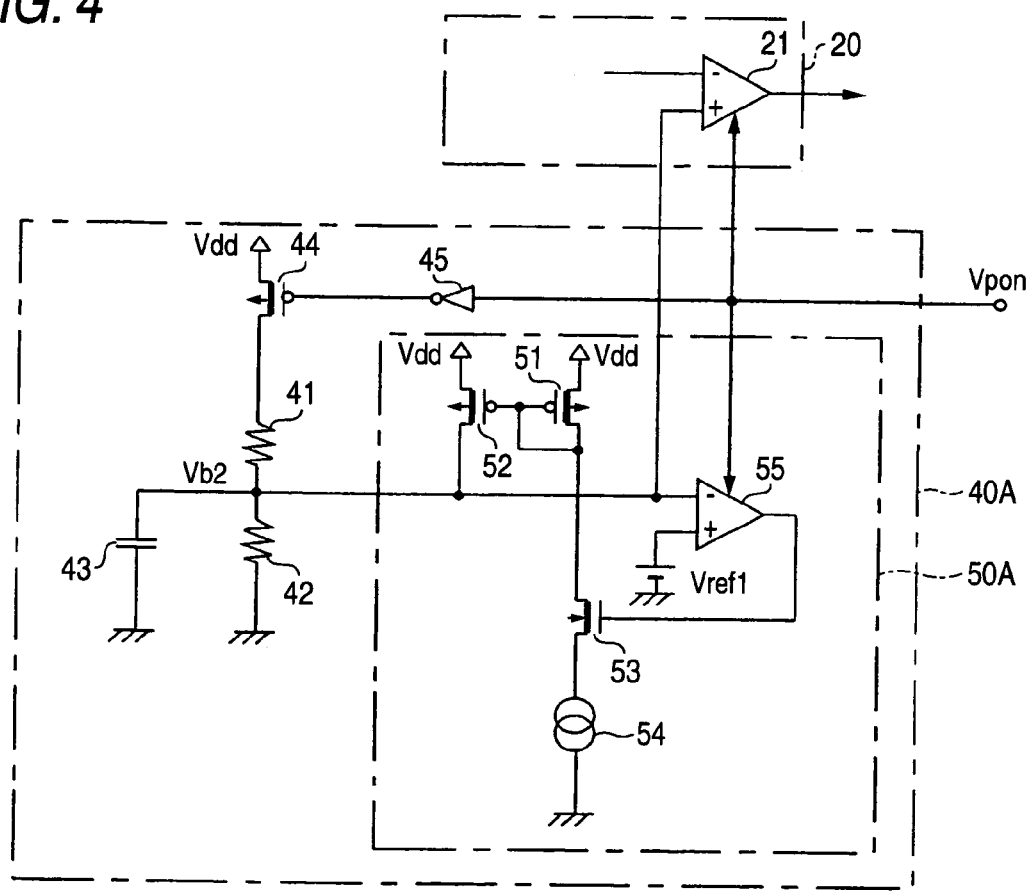
FIG. 4 is a view showing the configuration of the electronic device according to a third embodiment of the invention, wherein a constant current circuit is used for a bias acceleration circuit 50A.
Figure 5:
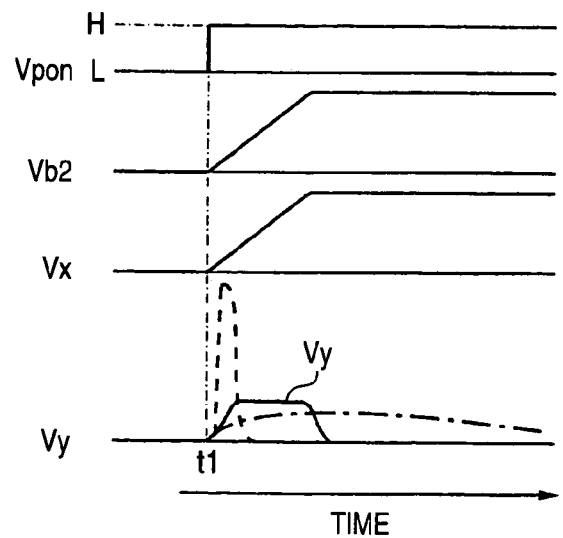
FIG. 5 is a view showing a characteristic of the acceleration circuit shown in FIG. 4 when the circuit is activated.

FIG. 3 shows a second embodiment of the electronic device having the sound output module according to the invention and is a view showing a configuration provided with a bias control circuit (hereinafter called a "bias acceleration circuit"). FIG. 4 is a view showing a configuration which relates to a third embodiment of the invention and uses a constant-current circuit for the bias acceleration circuit. FIG. 5 is a view showing a characteristic obtained when the bias acceleration circuit shown in FIG. 4 is activated.

FIG. 3 differs from FIG. 1 in that the second bias circuit 40A is provided with a bias acceleration circuit 50. Instead of being provided in the second bias circuit 40A, the bias acceleration circuit 50 might be provided as a separate circuit.

The bias acceleration circuit 50 starts operation in accordance with an H level of the ON-OFF control signal Vpon and supplies a recharge current to the capacitor 43 such that an increase in the bias voltage Vb2 is accelerated to the limitation of a range in which the pop sound is allowed. At a point in time when the bias voltage Vb2 has reached a predetermined value, the operation of the bias acceleration circuit 50 is stopped.

The resistance values of the resistors 41, 42 that determine the magnitude of the bias voltage Vb2 at a steady state might be to be increased so as to reduce power consumption. Meanwhile, if the resistance values of the resistors 41, 42 are determined, the capacitance of the capacitor 43 is causally determined in order to determine a desired rise characteristic of the bias voltage Vb2; that is, a time constant (CxR). Consequently, when the resistance values of the resistors 41, 42 are set to large values in order to reduce power consumption, the capacitance of the capacitor 43 is set to a small value.

Turning to the noise superimposed on the source voltage by improving the power supply rejection ratio (PSRR), storing the maximum-possible capacitance to the capacitor 43 is desirable for reducing fluctuations in the bias voltage Vb2. This is because such a condition makes a stable amplifying operation which leads to produce a high-quality output signal. This is another important problem for a portable cellular phone, which has limited power capacity due to adopting a battery as a power source.

As the result of adopting the bias acceleration circuit 50 of the invention, an increase in the bias voltage Vb2 is achieved within a predetermined period of time, meanwhile the pop sound associated with an increase in the bias voltage Vb2 can be limited. Further, in the bias circuit 40A, the resistors 41, 42 having large resistance values can be provided and the capacitor 43 having relatively a large capacitance can be also provided, whereby he power supply rejection ratio (PSRR) can be improved without sacrificing characteristics of the power consumption.

In the third embodiment of the invention shown in FIG. 4, the bias acceleration circuit 50A is equipped with a PMOS 52 which serves as an output side of a current mirror circuit having a drain connected to an output point of the bias voltage Vb2; and a PMOS 51 which serves as an input side of the current mirror circuit having a drain connected to the gate of the PMOS 52. The drain of the PMOS 51 is connected to a constant current source 54 byway of an n-type MOS transistor (hereinafter abbreviated as "NMOS") 53.

There is also provided a comparator 55 which compares the bias voltage Vb2 with the reference voltage Vref1 and controls activation/deactivation of the NMOS53 by means of a comparison output. The comparator 55 initiates operation at an H level of the ON-OFF control signal Vpon.

The operation of the bias acceleration circuit shown in FIG. 4 will be described by reference to FIG. 5, which shows a characteristic achieved at the time of activation of the bias acceleration circuit. When the ON-OFF control signal Vpon has become high, the output amplifier 20 is activated, and the PMOS 44 is also activated, thereby initiating recharging of the capacitor 43. Concurrently, the comparator 55 also starts operation, and the NMOS 53 is activated by means of an output from the comparator 55. Recharging of the capacitor 43 with a constant current corresponding to the current of the constant current source 54 and by way of the output-side PMOS 52 is started. This state is denoted as a point in time t1 in FIG. 5.

From the point in time t1, the bias voltage Vb2 increases linearly with lapse of time by means of a constant current. As a matter of course, an electric current also flows to the resistors 41, 42. When compared with the electric current flowing through the output-side PMOS 52, the electric current is small and hence is represented linearly. When the capacitor 43 has been recharged and the bias voltage Vb2 has reached the reference voltage Vref1, an output from the comparator 55 is reversed to an L level, thereby completing the operation of the current mirror circuit and deactivating the output-side PMOS 52.

The voltage Vx appearing at the point X located at one end of the coupling capacitor Cc changes in the same manner as does the bias voltage Vb2. Hence, the voltage Vy appearing at the point Y located at the other end of the coupling capacitor Cc assumes a value corresponding to a rate of change in the voltage Vx. When compared with the characteristic (designated by dashed lines in the drawing) obtained when the bias acceleration circuit 50A is not provided, the change in the voltage Vy has finished within a considerably short period of time. Further, although the magnitude of the voltage Vy has come to be slightly larger, the magnitude still remains at a considerably small value when compared with the characteristic (designated by broken lines in the drawing) achieved by the related-art electronic device.

As the result, even with the bias circuit 40A whose power supply rejection ratio (PSRR) has been improved by increasing the capacitance of the capacitor 43, it can speed up the rise of the bias voltage Vb2 and diminish the pop sound produced when the circuit is activated.

Figure 6:
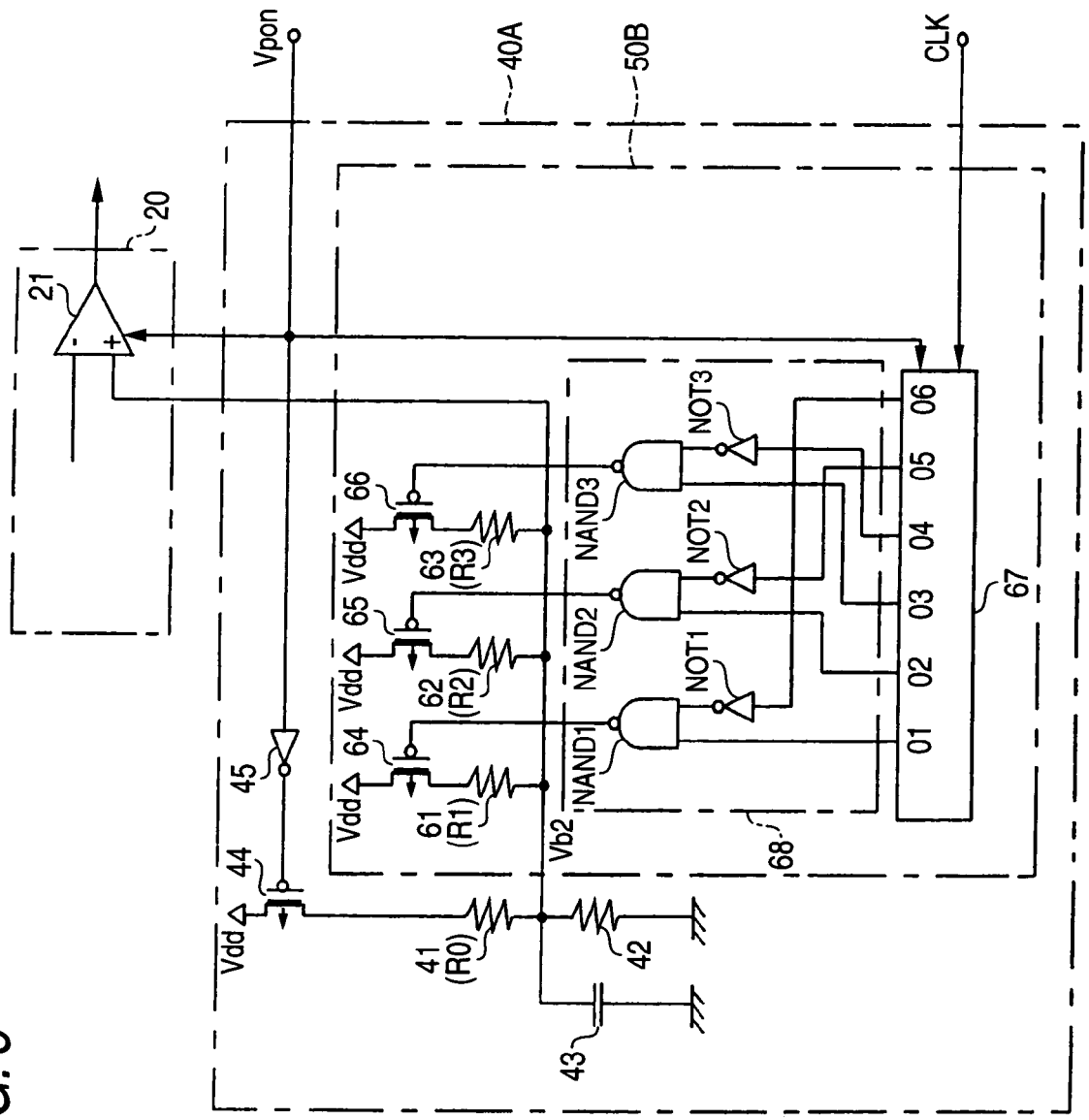
FIG. 6 is a view showing the configuration of the electronic device according to a fourth embodiment of the invention, wherein a resistor network of ladder type and a circuit for subjecting the resistance value of the resistor network to time control are used for a bias acceleration circuit 50B.
Figure 7A:
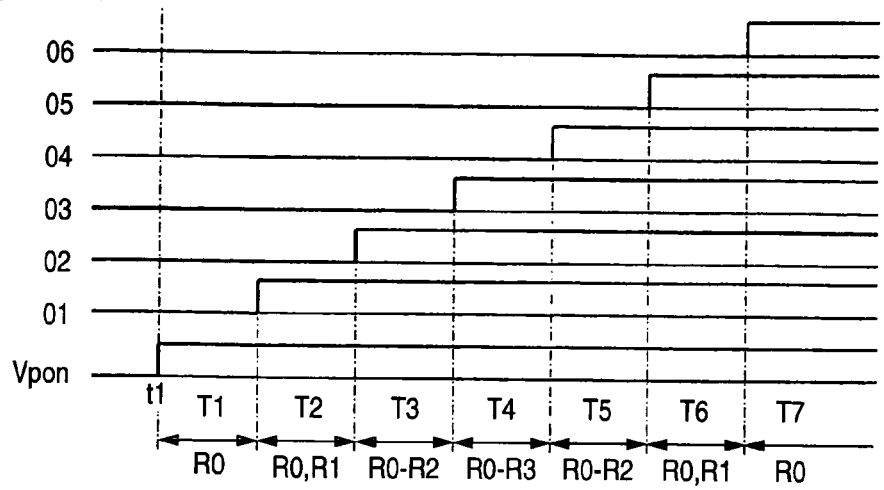
FIG. 7 is a view showing descriptions and characteristics of the operation of the bias acceleration circuit shown in FIG. 6 when the circuit is activated.
Figure 7B:
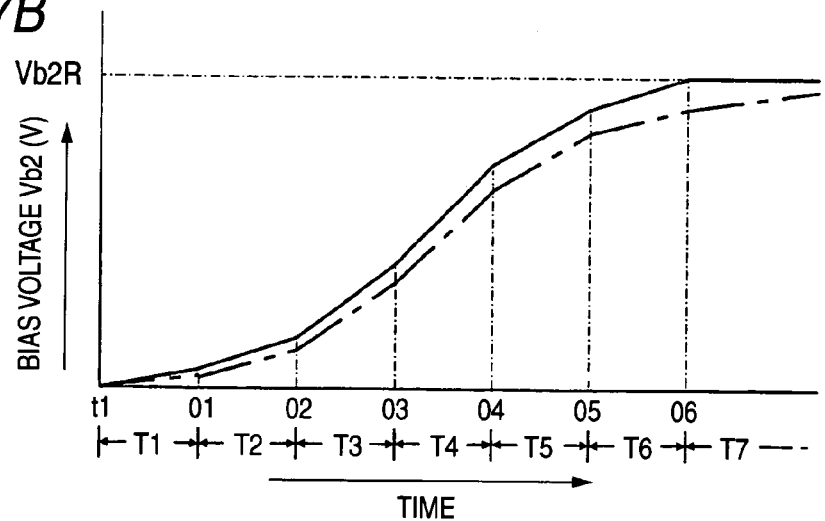
Figure 7C:
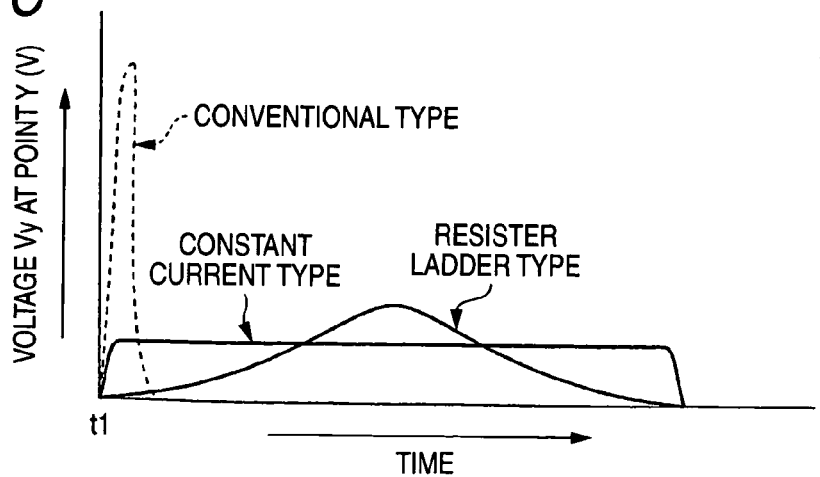

FIG. 6 is a view showing a configuration which relates to a fourth embodiment of the invention and uses a ladder resistor circuit network as a bias acceleration circuit 50B and a circuit for subjecting the resistance value of the network to time control. FIGS. 7A, 7B, and 7C are views describing operation performed when the bias acceleration circuit shown in FIG. 6 is activated and showing a characteristic thereof.

In FIG. 6, the bias acceleration circuit 50B comprises a pair consisting of a PMOS 64 and a first acceleration resistor (having a resistance value R1), another pair consisting of a PMOS 65 and a second acceleration resistor 62 (having a resistance value R2), and yet another pair consisting of a PMOS 66 and a third acceleration resistor 63 (having a resistance value R3), all the pairs being connected in parallel between an output point of the bias voltage Vb2 and the source voltage Vdd. The bias acceleration circuit 50B further comprises a counter 67 and a logic circuit 68. Upon receipt of an input of a clock signal CLK, the counter 67 counts the clock signal CLK at H levels of an ON-OFF control signal Vpon, thereby sequentially producing count outputs 01 to 06. Upon receipt of the count outputs 01 to 06, the logic circuit 68 outputs a gate control signal for activating or deactivating PMOSs 64 to 66.

The logic circuit 68 is constituted of NAND circuits NAND1 to NAND3 and inverter circuits NOT1 to NOT3, all being constituted as illustrated. As shown in FIG. 7A, all the PMOSs 64 to 66 are deactivated during a first period T1 from a point in time t1 at which the ON-OFF control signal Vpon has become high until the count output 01 becomes high. Only the PMOS 64 is activated during a second period T2 from the end of the first period T1 until the count output 02 becomes high. The PMOSs 64, 65 are activated during a third period T3 from the end of the second period T2 until the count output 03 becomes high. All the PMOSs 64, 65, 66 are activated during a fourth period T4 from the end of the third period T3 until the count output 04 becomes high. The PMOSs 64, 65 are activated during a fifth period T5 from the end of the fourth period T4 until the count output 05 becomes high. Only the PMOS 64 is activated during a sixth period T6 from the end of the fifth period T5 until the count output 06 becomes high. Finally, all the PMOSs 64, 65, and 66 are deactivated during a seventh period T7 from the end of the sixth period T6 until the count output 06 becomes high.

Operation of the bias circuit 40A using the resistor network of resistor ladder type shown in FIG. 6 will now be described by reference to FIG. 7.

When the ON-OFF control signal Vpon has become high at the point in time t1, the counter 67 starts counting of the clock signal CLK. During the period T1, the capacitor 43 is recharged by way of only the resistor 41 (whose resistance value is denoted as R0). Since the resistance value R0 is large, an increase in the bias voltage Vb2 is considerably gradual.

During the period T2, the resistors 41 and 61 are connected in parallel (R0//R1, wherein // denotes a parallel connection). During the period T3, the resistors 41, 61, and 62 are connected in parallel (R0//R1//R2). During the period T4, the resistors 41, 61, 62, and 63 are connected in parallel (R0//R1//R2//R3). From the period T1 to the period T4, the parallel resistance values used for recharging the capacitor 43 become gradually smaller. Hence, the rate of increase in the bias voltage Vb2 per unit time is gradually increased.

During the period T5, the resistors 41, 61, and 62 are connected in parallel (R0//R1//R2). During the period T6, the resistors 41 and 61 are connected in parallel (R0//R1). During the period T7, only the resistor 41 remains connected (R0). From the period T5 to the period T7, the parallel resistance values used for recharging the capacitor 43 become gradually larger. Hence, the rate of increase in the bias voltage Vb2 per unit time becomes gradually smaller.

FIG. 7B schematically shows a relationship between the lapse of time (T1–T7) and the bias voltage Vb2. The lengths of the periods T1 to T6 and the resistance values of the resistors 41, 61 to 63 are set appropriately, thereby changing a change rate in the bias voltage Vb2 smoothly with time. In the drawings, a change in the bias voltage Vb2 during the respective periods actually assumes a characteristic of curve determined by a resistor and a capacitor. However, for the sake of simplicity, the change is expressed as a straight line.

In the embodiment, the accuracy of the bias voltage Vb2 is determined from the time determined by counting the clock CLK and the resistance values of the resistors 41, 61 to 63. Consequently, when the resistance value differs from a predetermined value (i.e., a designed value), the bias voltage Vb2 may deviate from a predetermined bias voltage Vb2R at the end of the period T6, as indicated by a dashed line shown in FIG. 7B. In this case, during the period T7 the capacitor 43 is recharged (or discharged) up to the predetermined bias voltage Vb2R determined by a rate of partial pressures of the resistors 41, 42 by way of the resistor 41 (or resistor 42).

As shown in FIG. 7C, in the bias circuit 40A using the resistor network of resistor ladder type, a change in the voltage Vy obtained at the point Y becomes not only smoother than that achieved in the related-art, as a matter of course, but also smoother than that achieved by the bias acceleration circuit shown in FIG. 4. Consequently, the pop sound can be more effectively suppressed. Further, the control means for suppressing a pop sound can be constituted of simple circuits; that is, a counter and a logic circuit.

Figure 8:
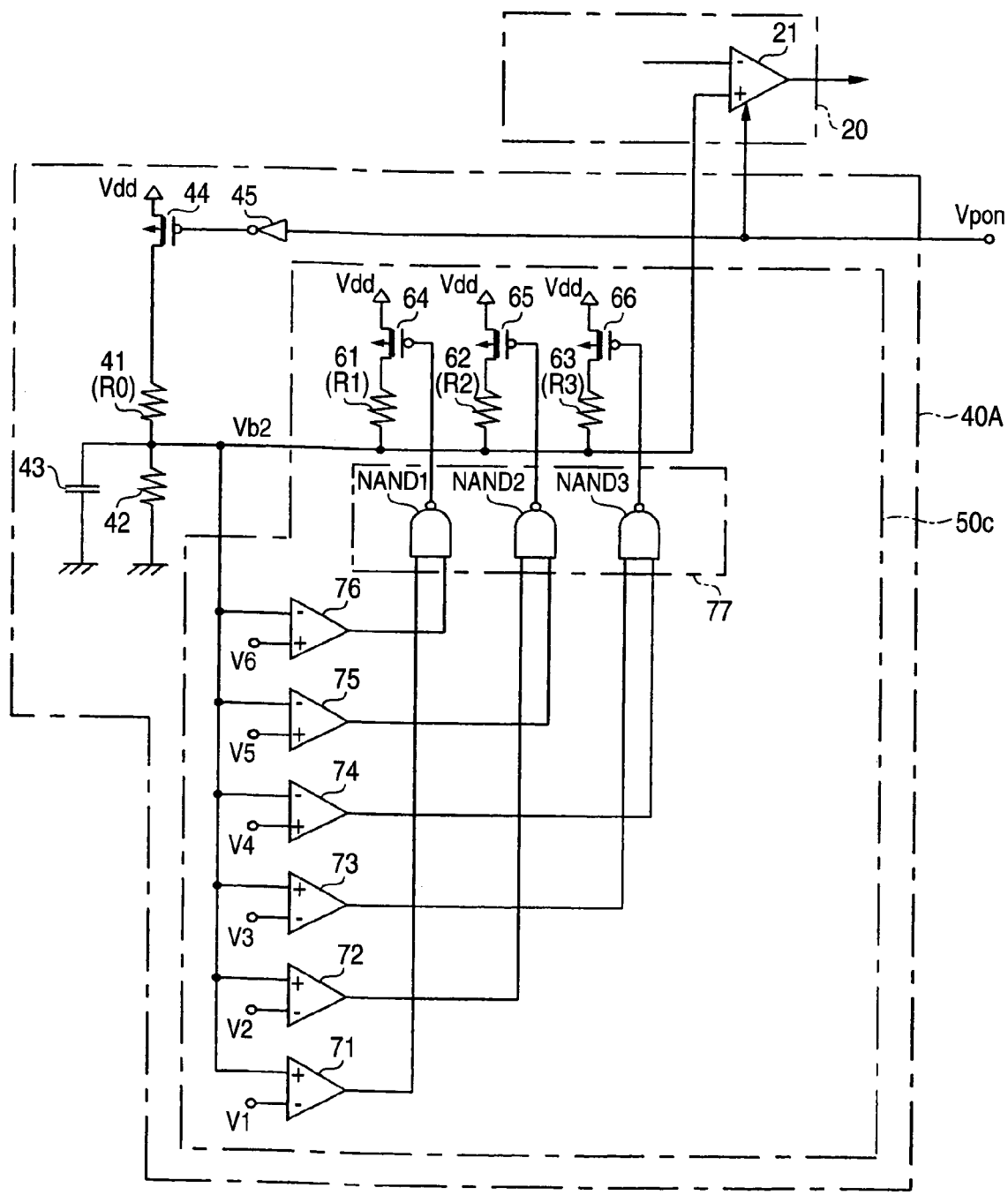
FIG. 8 is a view showing the configuration of the electronic device according to a fifth embodiment of the invention, wherein a resistor network of ladder type and a circuit for subjecting the resistance value of the resistor network to voltage control are used for a bias acceleration circuit 50C.
Figure 9:
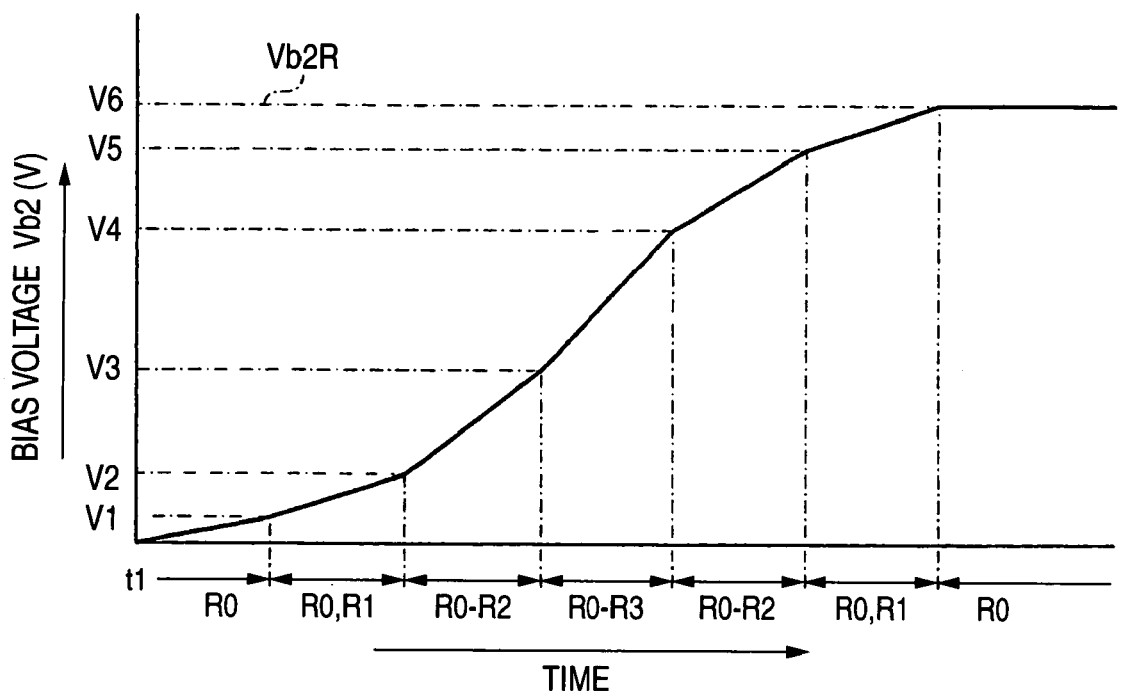
FIG. 9 is a view showing a characteristic of the circuit shown in FIG. 8 when the circuit is activated.

FIG. 8 is a view showing a configuration which is related to a fifth embodiment of the invention and uses a resistor network of ladder type as a bias acceleration circuit 50C, and a circuit for subjecting a resistance value of the network to voltage control. FIG. 9 is a view showing a characteristic of the bias acceleration circuit when the circuit is activated as shown in FIG. 8.

In the bias acceleration circuit 50C shown in FIG. 8, the resistance value of the resistor network of ladder type is controlled by detecting a voltage value of the bias voltage Vb2. In this regard, the bias acceleration circuit 50C differs from the bias acceleration circuit 50B shown in FIG. 7, and in other respects they are identical with each other.

As shown in FIG. 8, the bias acceleration circuit 50C has first through sixth comparators 71 to 76 for comparing the bias voltage Vb2 with first to sixth voltages V1 to V6; and a logic circuit 77 for controlling the PMOSs 64 to 66 on the basis of the comparison results of the comparators 71 to 76. The logic circuit 77 has the NAND circuits NAND1 to NAND3. The first through sixth voltages V1 to V6 are set so as to assume a relationship V1<V2<V3<V4<V5<V6. The sixth voltage V6 is set so as to be equal to the predetermined bias voltage Vb2R (V6=Vb2R).

Operation of the bias circuit 40A which controls the voltage of the resistor network of resistor ladder type shown in FIG. 8 will be described by reference to FIG. 9.

When the ON-OFF control signal Vpon has become high at the point in time t1, the PMOS 44 is activated, and the capacitor 43 is recharged by way of only the resistor 41. Since the resistance value R0 is large, an increase in the bias voltage Vb2 is considerably gradual. When the bias voltage Vb2 has reached the first voltage V1, an output from the comparator 71 is reversed (from a low level to a high level), and the resistor 61 is connected in parallel with the resistor 41. Likewise, outputs from the comparators 72 to 76 are reversed (from a low level to a high level, or vice versa) when the bias voltage Vb2 reaches any of the second voltage V2 to the sixth voltage V6. A sequence for changing the resistance value of the resistor network is analogous to that shown in FIG. 6.

In the embodiment, voltage control is performed by use of comparators 71 to 76. Hence, the accuracy of the bias voltage Vb2 is not dependent on variations in the resistance values of the resistors 41, 61 to 63. At a point in time when the output from the sixth comparator 76 is reversed, the predetermined bias voltage Vb2R is obtained. Consequently, additional charge/recharge time required by only the resistors 41, 42 is not necessary. Even when the clock signal CLK is not obtained, a sequence for changing the resistance value of the resistor network can be implemented. The remaining effects are the same as those yielded in the fourth embodiment shown in FIG. 6.

Figure 10:
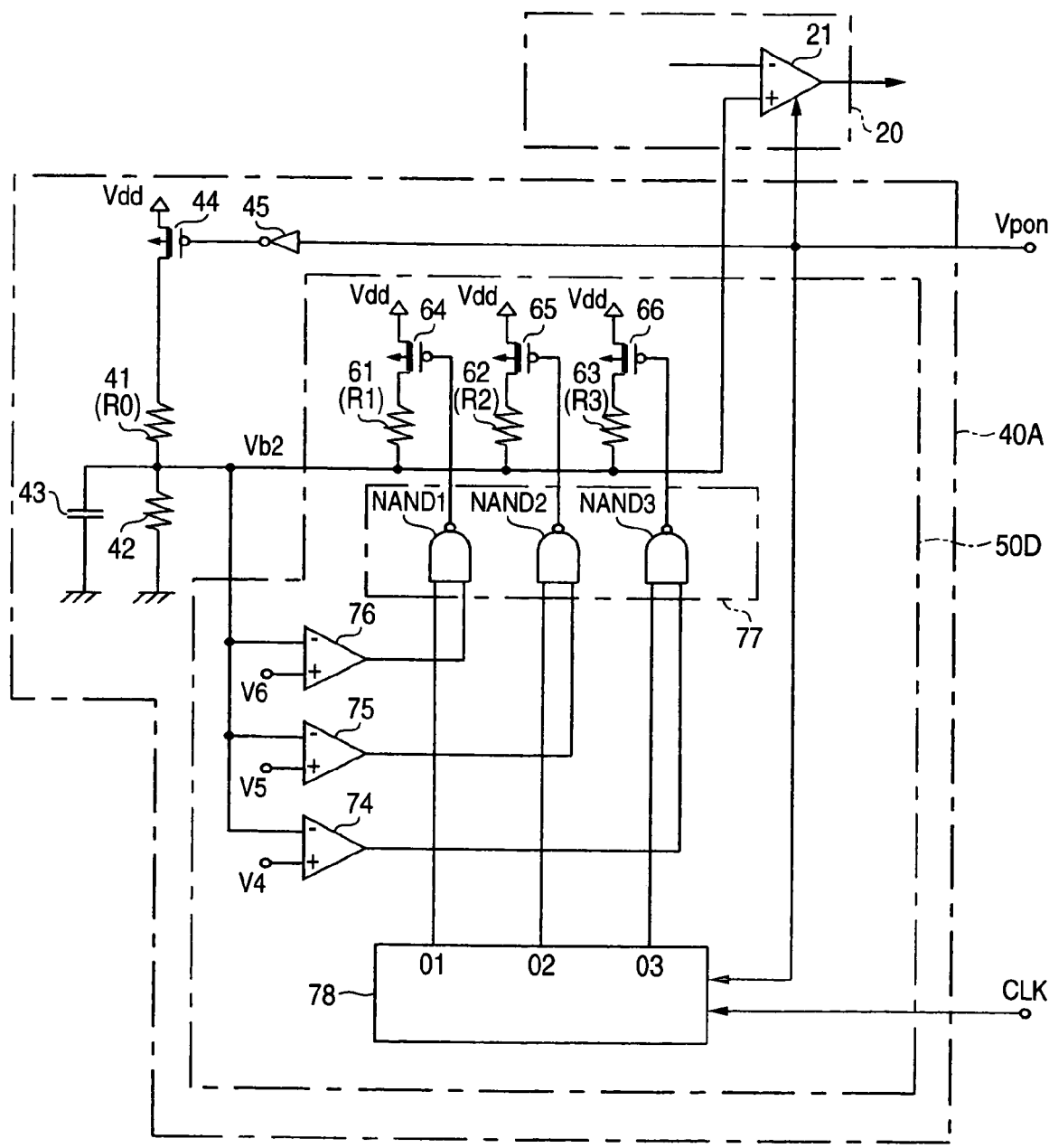
FIG. 10 is a view showing the configuration of the electronic device according to a sixth embodiment of the invention, wherein a resistor network of ladder type and a circuit for subjecting the resistance value of the resistor network to voltage control are used for a bias acceleration circuit 50D.
Figure 11:
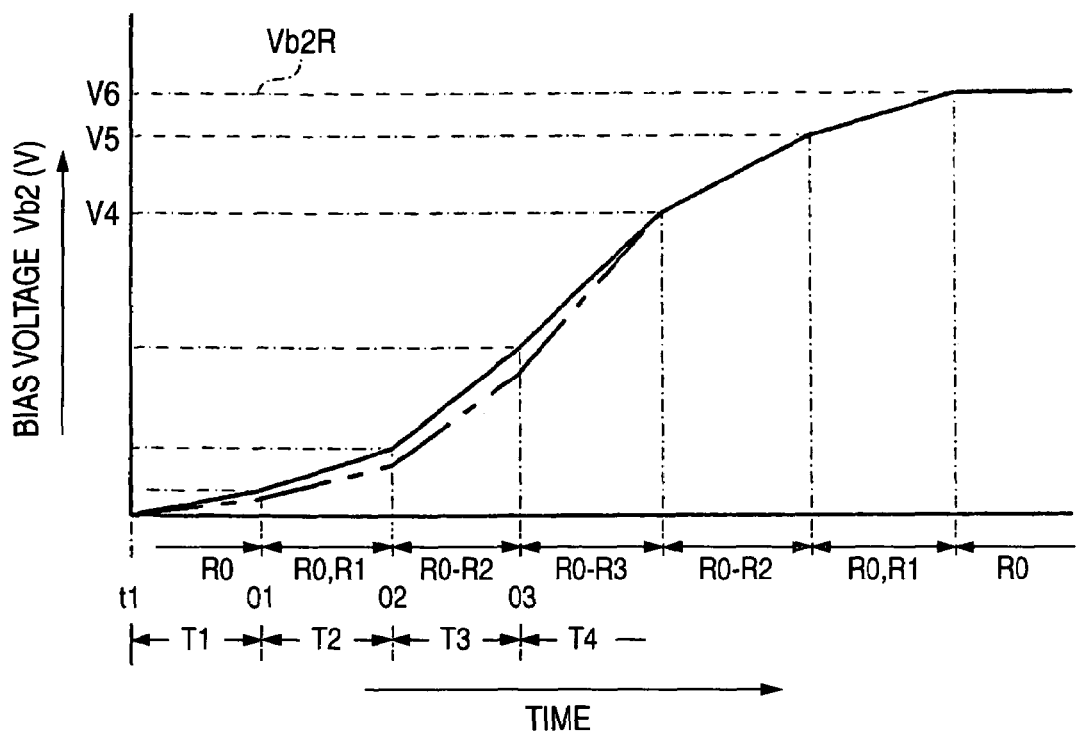
FIG. 11 is a view showing a characteristic of the circuit shown in FIG. 10 when the circuit is activated.

FIG. 10 is a view showing a configuration which relates to a sixth embodiment of the invention and employs a resistor network of ladder type as a bias acceleration circuit 50D, and a circuit for subjecting the resistance value of the, bias acceleration circuit to time control and voltage control. FIG. 11 is a view showing a characteristic of the bias acceleration circuit when the circuit is activated as shown in FIG. 10.

During the first half period including the first switch control signal, the bias acceleration circuit 50D shown in FIG. 10 performs a sequence for changing the resistance value of the resistor network of ladder type through use of a count signal of a counter for controlling time. During a second half period including the final switch signal, the bias acceleration circuit 50D performs the sequence through use of a comparison output from the comparator for detecting the voltage value of the bias voltage Vb2. This bias acceleration circuit 50D differs from the bias acceleration circuit 50B shown in FIG. 7 and the bias acceleration circuit 50C shown in FIG. 8 in that the bias acceleration circuit 50D performs control operation of mixed type. In other respects, the bias acceleration circuit 50D is identical with the bias acceleration circuits 50B and 50C.

In FIG. 10, the bias acceleration circuit 50D comprises a counter 78 which receives the clock signal CLK, counts the clock signal CLK at H levels of the ON-OFF control signal Vpon, and sequentially produces the count outputs 01 to 03; fourth to sixth comparators 74 to 76 for comparing the bias voltage Vb2 with fourth to sixth voltages V4 to V6; and a logic circuit 77 for controlling the PMOSs 64 to 66 on the basis of the count outputs 01 to 03 and comparison results of the comparators 74 to 76. The logic circuit 77 has the NAND circuits NAND1 to NAND3. The count outputs 01 to 03 become high, in this sequence. Subsequently, the comparison outputs from the comparators 74 to 76 are sequentially output. The fourth to sixth voltages V4 to V6 are set so as to assume a relationship V4<V5<V6. The sixth voltage V6 is set so as to be equal to the predetermined bias voltage Vb2R (V6=Vb2R).

Operation of the bias circuit 40A for subjecting the resistor network of resistor ladder type shown in FIG. 10 to time and voltage control will be described by reference to FIG. 11.

When the ON-OFF control signal Vpon has become high at the point in time t1, the PMOS 44 is activated, thereby recharging the capacitor 43 by way of only the resistor 41. During the period T1, the resistance value R0 is large, and hence an increase in the bias voltage Vb2 is considerably gentle. Concurrently, the counter 78 initiates counting of the clock signal CLK.

When the counter output 01 is produced, processing enters the period T2. When the counter output 02 is produced, processing enters the period T3. When the counter output 03 is produced, processing enters the period T4. From the periods T1 to T4, the parallel resistance values used for recharging the capacitor 43 become gradually smaller, and the rate of increase in the bias voltage Vb2 per unit time gradually increases.

During the period T4, the operation for recharging the capacitor 43 proceeds. When the bias voltage Vb2 has reached V4, the comparison output from the comparator 74 is reversed to an L level. When the bias voltage Vb2 has reached V5, the comparison output from the comparator 75 is reversed to an L level. Finally, when the bias voltage Vb2 has reached V6, the comparison output from the comparator 76 is reversed to an L level. In this state, the bias voltage Vb2 is determined by the resistors 41, 42 and the capacitor 43.

During a first half period, the sequence for changing the resistance value of the resistor network of ladder type is performed through use of the count signals 01 to 03 of the counter 78. During a second half period, the comparison outputs from the comparators 74 to 76 are employed. However, the sequence for changing the resistance value of the resistor network is identical with that shown in FIGS. 6 and 8.

In this embodiment, during a first half period, time control is performed through use of the count signals 01 to 03 output from the counter 78, whereas during a second half period, voltage control is performed through use of the comparators 74 to 76. Consequently, the number of comparators to be used for performing voltage control can be reduced.

As indicated by the dashed line in FIG. 11, even when the characteristic of the bias voltage Vb2 has deviated from a predetermined characteristic for reasons of variations in the resistance values of the resistors 41, 61 to 63, the variations are absorbed at a point in time when the fourth comparator 74 is reversed during a second half period. At a point in time when the sixth comparator 76 is reversed, the predetermined bias voltage Vb2R is obtained. Therefore, an additional recharge/discharge time required by only the resistors 41, 42 becomes unnecessary. Here, the second half period during which the voltage is controlled through use of the comparators can be shortened to a great extent (e.g., to only a period T6).

In this embodiment, when the clock signal is obtained, a highly-accurate bias voltage Vb2 is obtained, and a required circuit configuration can be made small. Hence, a considerable, practical effect can be achieved.

The number of network ladders of the resistor network has been described as three. As a matter of course, the number is exemplary. In accordance with a characteristic required by the bias voltage Vb2, the number of ladders can be set to an arbitrary number of one or more.

According to the invention, in an electronic device having a sound output module equipped with a preamplifier requiring a bias voltage and at least one output amplifier, the output amplifiers can be activated or deactivated individually. Further, a pop sound arising at the time of activation of the output amplifier can be diminished.

Moreover, according to the invention, the output amplifiers requiring a bias voltage can be activated or deactivated individually. Further, a bias acceleration circuit for rapidly increasing the magnitude of a bias voltage in time can be provided in or with the bias circuit, As the result, even if the capacitance of the capacitor included in the bias circuit is increased for improving the power supply rejection ratio (PSRR), the rise in the bias voltage can be increased, and the pop sound which arises when the bias circuit is activated can be diminished.

What is claimed is:

1. A sound output module comprising:
   an output amplifier, which can be activated and deactivated individually, requires a bias voltage, and receives an output from a preamplifier;
   a bias circuit, comprising at least a resistor and a capacitor, which operates to produce said bias voltage, said bias voltage gradually increasing at a time constant determined by a value of the capacitor and in accordance with an ON-state signal sent to said output amplifier; and
   a bias adjustment circuit which further increases the magnitude of the bias voltage produced by said bias circuit to a predetermined value within a predetermined period of time.

2. The sound output module according to claim 1, wherein said bias adjustment circuit comprises a constant-current circuit for supplying a constant current to an output point of said bias circuit, and a voltage comparison circuit which initiates an operation in accordance with said ON-state signal and activates said constant-current circuit until said bias voltage reaches a predetermined voltage.

3. The sound output module according to claim 1, wherein said bias adjustment circuit further comprises:
   a resistor network, being connected between an output point of said bias circuit and a source voltage, which enables a change in a resistance value by means of one or a plurality of switches; and a switch control circuit which initiates operation in accordance with said ON-state signal and produces a switch control signal for controlling said switch such that the resistance value of said resistor network is changed in a sequence of a decreasing resistance value and then in a sequence of an increasing resistance value.

4. The sound output module according to claim 3, wherein said switch control circuit comprises a counter which is configured to receive said ON-state signal and a clock signal, counts said clock signal which is counted upon receiving of said ON-state signal, and outputs a predetermined count signal; and a logic circuit for producing said switch control signal in accordance with said count signal.

5. The sound output module according to claim 3, wherein said switch control circuit comprises a plurality of comparators which compare said bias voltage with comparison voltages being differed from each other in order to produce comparison results; and a logic circuit for generating said switch control signal in accordance with comparison outputs from said plurality of comparators.

6. The sound output module according to claim 3, wherein said switch control circuit comprises:
   a counter which is configured to receive said ON-state signal and a clock signal, counting said clock signal upon receival of said ON-state signal, producing a predetermined count signal to be used during a first half period including a first switch control signal;
   a plurality of comparators for comparing said bias voltage with comparison voltages being differed from each other in order to produce comparison results to be used during a second half period including a final switch control signal; and
   a logic circuit which receives said count signal and comparison outputs from said plurality of comparators, produces said switch control signal in accordance with said count signal during said first half period including said first switch control signal, and produces said switch control signal in accordance with said comparison outputs during the second half period including the final switch control signal.

* * * * *